(12) United States Patent
Sanner et al.

(10) Patent No.: US 12,101,065 B2
(45) Date of Patent: *Sep. 24, 2024

(54) DUAL VOLTAGE SWITCHED BRANCH LNA ARCHITECTURE

(71) Applicant: pSemi Corporation, San Diego, CA (US)

(72) Inventors: Miles Sanner, San Diego, CA (US); Emre Ayranci, Costa Mesa, CA (US); Parvez Daruwalla, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/492,544

(22) Filed: Oct. 23, 2023

(65) Prior Publication Data

US 2024/0113665 A1 Apr. 4, 2024

Related U.S. Application Data

(63) Continuation of application No. 18/168,346, filed on Feb. 13, 2023, now Pat. No. 11,831,280, which is a continuation of application No. 17/189,141, filed on Mar. 1, 2021, now Pat. No. 11,606,067.

(51) Int. Cl.
*H03F 1/22* (2006.01)
*H03F 3/193* (2006.01)
*H03F 3/21* (2006.01)

(52) U.S. Cl.
CPC ............. *H03F 1/223* (2013.01); *H03F 3/193* (2013.01); *H03F 3/21* (2013.01); *H03F 2200/294* (2013.01); *H03F 2203/7236* (2013.01)

(58) Field of Classification Search
CPC ........................................................ H03F 1/22
USPC ........................................................ 330/51, 311
See application file for complete search history.

(56) References Cited

U.S. PATENT DOCUMENTS

| 9,419,565 | B2 * | 8/2016 | Nobbe | H04B 17/12 |
| 9,800,211 | B2 * | 10/2017 | Nobbe | H04L 27/20 |
| 11,190,139 | B2 * | 11/2021 | Wagh | H03F 3/193 |
| 11,601,094 | B2 * | 3/2023 | Klaren | H03F 1/0266 |
| 11,606,067 | B2 | 3/2023 | Sanner et al. | |
| 11,831,280 | B2 | 11/2023 | Sanner et al. | |

(Continued)

*Primary Examiner* — Henry Choe
(74) *Attorney, Agent, or Firm* — Steinfl + Bruno LLP

(57) ABSTRACT

Methods and circuital arrangements for turning OFF branches of a multi-branch cascode amplifier are presented. First and second switching arrangements coupled to a branch allow turning OFF the branch while protecting transistors of the branch from a supply voltage that may be greater than a tolerable voltage of the transistors. The first switching arrangement includes a transistor-based switch that is in series connection with the transistors of the branch. The first switching arrangement drops the supply voltage during the OFF state of the branch and provides a conduction path for a current through the branch during the ON state of the branch. A resistor and a shunting switch are coupled to a gate of the transistor-based switch to reduce parasitic coupling effects of the transistor-based switch upon an RF signal coupled to the branch during the ON state and OFF state of the branch.

23 Claims, 13 Drawing Sheets

(56) References Cited

U.S. PATENT DOCUMENTS

| | | | |
|---|---|---|---|
| 11,949,385 B2 * | 4/2024 | Klaren | ............... H03F 1/0266 |
| 2023/0253926 A1 | 8/2023 | Sanner et al. | |

* cited by examiner

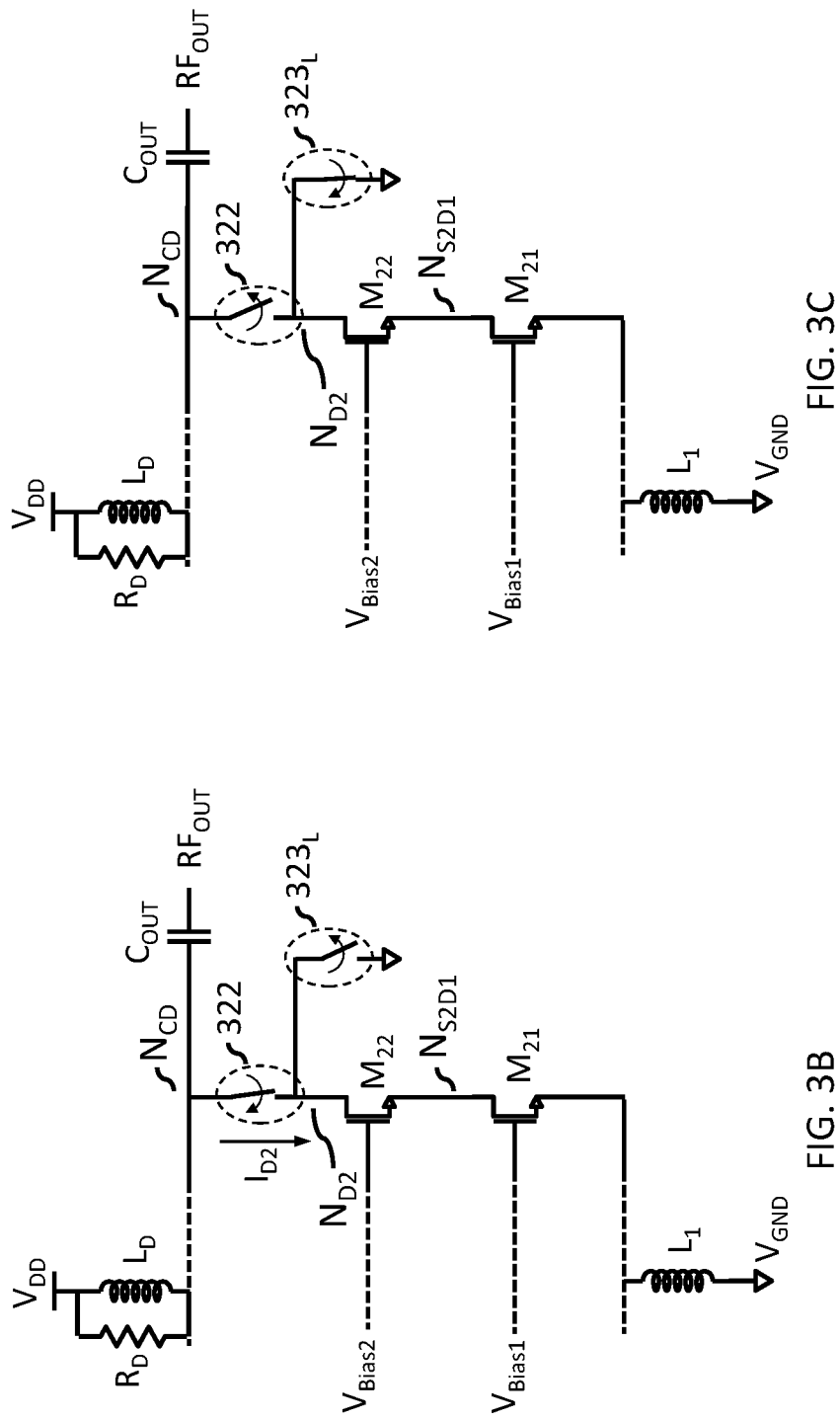

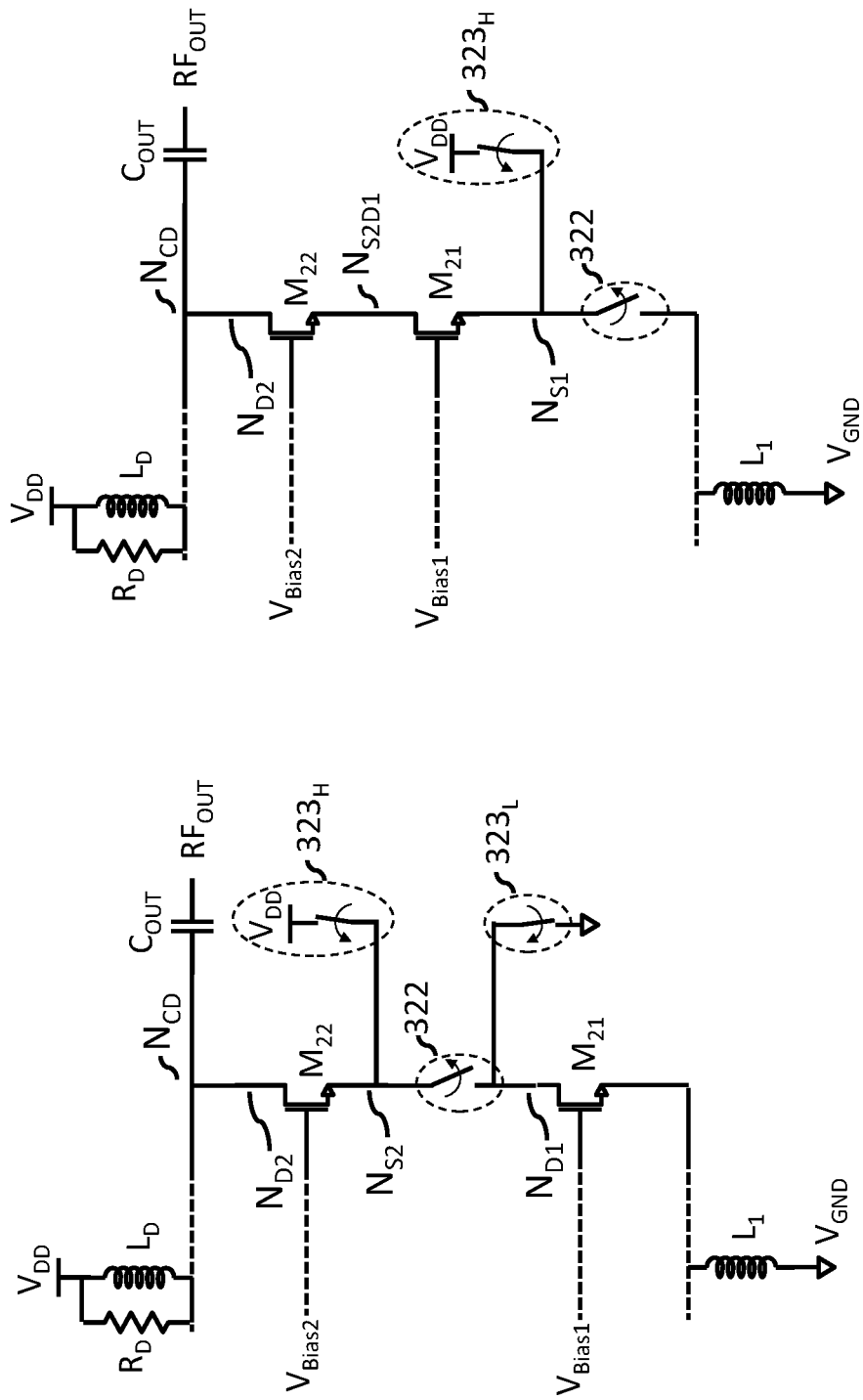

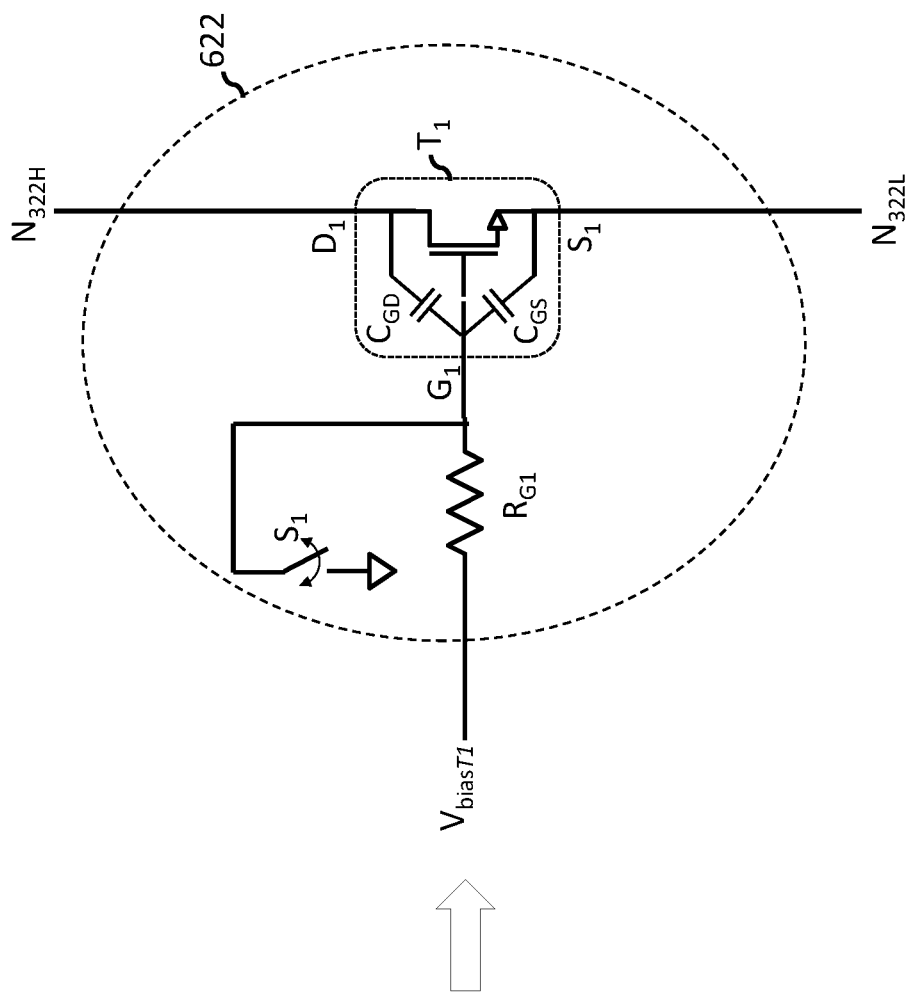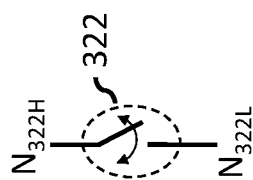
FIG. 6A

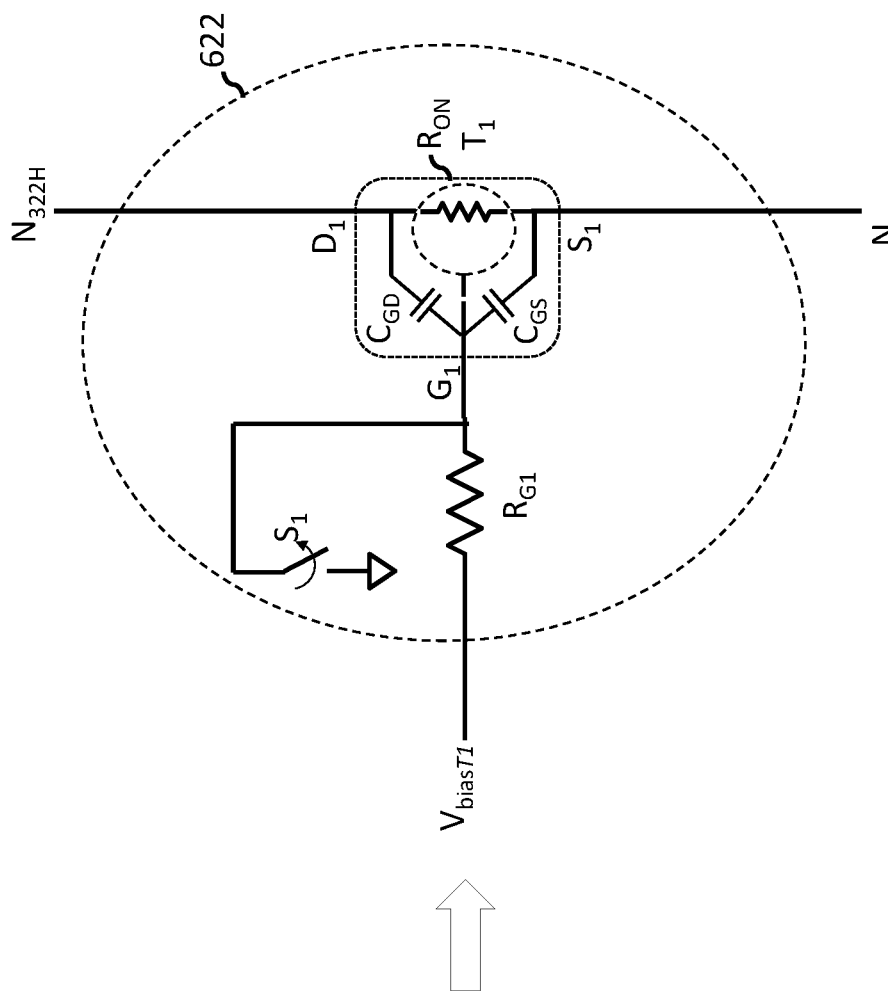
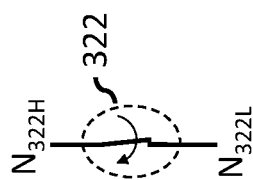
FIG. 6B

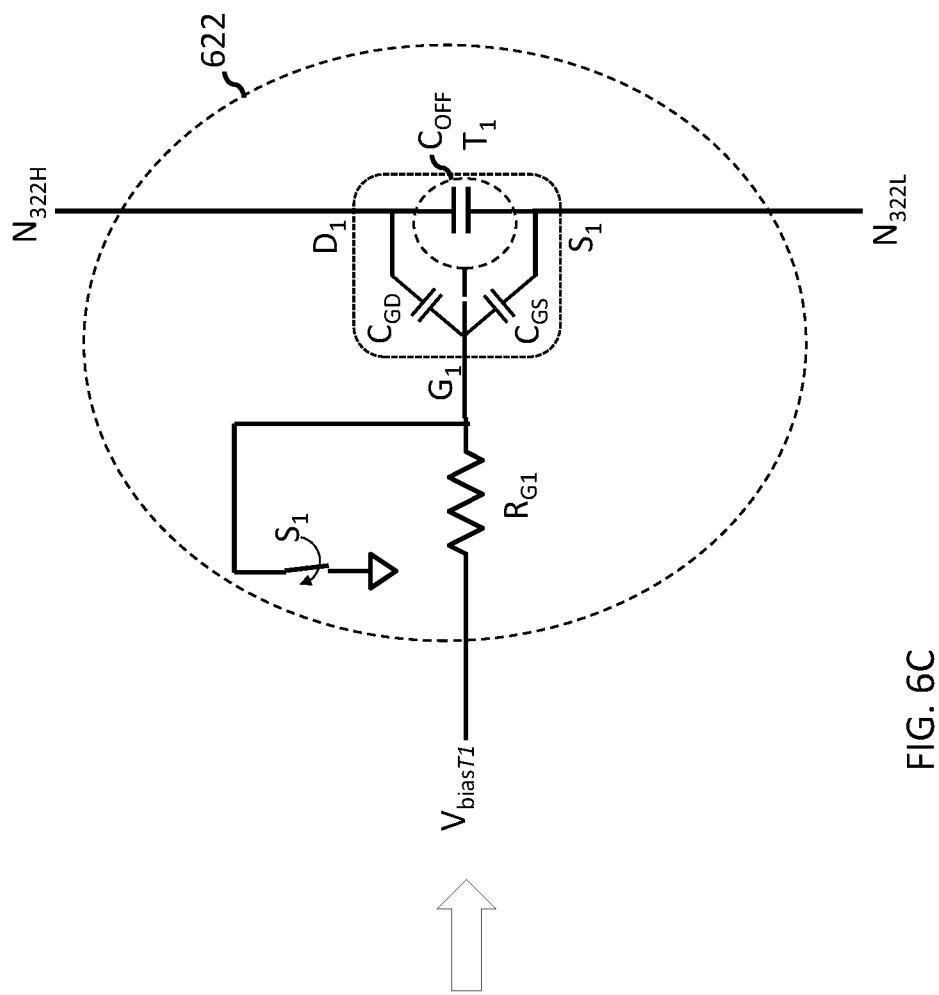
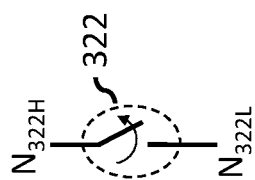
FIG. 6C

800a

810a: turning ON a plurality of branches of the multi-branch cascode amplifier by:
- providing to each branch of the plurality of branches respective gate biasing voltages to transistors of the branch for operation of the branch as an amplifier during a respective ON state of the branch, the transistors of the branch comprising a common-source input transistor and one or more common-gate cascode transistors; and
- based on the providing, outputting an amplified signal at a common output node of the multi-branch cascode amplifier; and

820a: turning OFF at least one branch of the plurality of branches by:
- decoupling the at least one branch from the common output node via a first switching arrangement, thereby obtaining a decoupled branch, and
- coupling a reference voltage to a drain node of an output transistor of the decoupled branch via a second switching arrangement, thereby maintaining operation of the transistors of the decoupled branch within their respective maximum tolerable voltages

FIG. 8A

DUAL VOLTAGE SWITCHED BRANCH LNA ARCHITECTURE

CROSS-REFERENCE TO RELATED APPLICATIONS

The present application is a continuation of U.S. patent application Ser. No. 18/168,346, filed on Feb. 13, 2023 for "Dual Voltage Switched Branch LNA Architecture" which is a continuation of U.S. patent application Ser. No. 17/189,141, filed on Mar. 1, 2021, now U.S. Pat. No. 11,606,067, all of which are herein incorporated by reference in their entireties.

TECHNICAL FIELD

The present application relates to amplifiers. In particular, the present application relates to turn OFF and protection of multi-branch amplifier architecture comprising multiple branches of stacked transistors configured to tolerate higher voltages than the reliability limit of the transistors of the branch when OFF, enabling performances while operating at higher voltages that are similar to performances achieved while operating in lower voltages.

BACKGROUND

In recent years, stacked cascode amplifiers, which use a plurality of transistors arranged as a stack (stacked transistors), have become predominant in radio frequency (RF) applications, such as, for example, power amplifiers (PAs) in transmitter sections of RF front-end modules, or as low-noise amplifiers (LNAs) in receiver sections of RF front-end modules. Due to the higher number of transistors in the stack, voltage handling capability of the amplifier is increased, thereby allowing the higher power, higher voltage outputs. Since the stacked transistors comprise individual low-voltage transistors, which can tolerate a voltage substantially lower than the output voltage of the amplifier, it is important to bias the low-voltage transistors of the stack such that they maintain operation within their tolerable voltage ranges (e.g., smaller than a maximum tolerable voltage). In cases where the amplifier can operate in different modes of operation, such as, for example, an active (amplification, ON, activated) mode and an inactive (no amplification, OFF, deactivated) mode, such voltage compliance of the low-voltage transistors of the stack must be maintained during each of the modes of operation.

FIG. 1 shows a prior art configuration of a stacked cascode amplifier (100) comprising an input transistor M1 for receiving an input RF signal, $RF_{IN}$, in series connection with a cascode output transistor M2 for outputting an amplified version, $RF_{OUT}$, of the input RF signal. DC blocking capacitor $C_{IN}$ is used to block DC biasing voltage provided to the input transistor M1 from the $RF_{IN}$ signal, while capacitor $C_{OUT}$ is used for both output matching and blocking supply voltage $V_{DD}$ from the $RF_{OUT}$ port. A supply voltage $V_{DD}$ is coupled to the drain of the output transistor M2 through an inductor $L_D$, and a reference ground $V_{GND}$ (e.g., GND or AC ground) is coupled to the source of the input transistor M1 through an optional inductor $L_1$ (e.g., degeneration inductor). An optional resistor, $R_D$, in parallel with the inductor $L_D$ can be used to control the amount of amplification of the input RF signal, $RF_{IN}$ and/or the Q and thus impact the bandwidth of the output match. It should be noted that a number p of the stacked transistors may be any integer number greater than or equal to two, and may be a function of a level of the supply voltage, tolerable voltage (e.g., handling voltage) ranges of the transistors (M1, M2, . . . , Mp), and the AC voltage swing at the drain terminal of transistor Mp.

In the prior art amplifier (100) of FIG. 1, biasing of the transistors M1 and M2 may be provided via respective biasing voltages $V_{Bias1}$ and $V_{Bias2}$ coupled to gates of the transistors via respective series resistors $R_{B1}$ and $R_{B2}$. A shunting gate capacitor, $C_{B2}$, coupled to the gate of the cascode transistor M2 is configured to short the gate of M2 at frequencies of operation (e.g., frequencies of the RF signal) of the amplifier (100) in order to provide a common-gate configuration of the cascode transistor M2. In some cases, such as in power amplifiers, the capacitor (e.g., $C_{B2}$) on the gate of the common gate devices may be of a smaller capacitance value as to provide a capacitive impedance to the gate at the frequencies of operation. On the other hand, at the frequencies of operation of the amplifier (100), the source of input transistor M1 is coupled to the reference ground either directly (no optional inductor L1) or through the optional inductor L1, so as to provide a common-source configuration of the input transistor.

In general, the stacked cascode amplifiers described in the present disclosure include a common-source input transistor and one or more common-gate cascode transistors. It is noted that a person skilled in the art is well aware of the principle of operation of the stacked cascode amplifier (100), including biasing of the cascode transistors (e.g., M2 of FIG. 1) for active current amplification/buffering when driven by the input transistor operating as a common-source amplifier. Such biasing of the cascode transistors (e.g., M2 of FIG. 1) configures the cascode transistors to operate in their respective saturation regions of operation (i.e., different from triode region of operation) and therefore actively participate in the amplification of the input RF signal (e.g., $R_{FIN}$ of FIG. 1).

The prior art amplifier (100) of FIG. 1 may operate according to at least two modes of operation, an active mode wherein both M1 and M2 are biased ON (i.e., turned ON) and the input RF signal is amplified by converting it to an RF current that flows through $L_D$ and generates AC voltage swing at the drain terminal of transistor M2, and an inactive mode wherein both transistors are turned OFF, and therefore no amplification occurs. Control of the amplifier (100) for operation according to the active mode or the inactive mode may be provided via the biasing voltages, $V_{Bias1}$ and $V_{Bias2}$. For example, by setting $V_{Bias1}$ and $V_{Bias2}$ to voltage values such that the gate-to-source and the drain-to-source voltages of the input transistor M1 are, respectively, greater than a threshold voltage, Vth, and a saturation voltage, Vs at of the input transistor M1, the input RF signal, $RF_{IN}$, is converted to current by transistor M1 and conducted to Ld to generate voltage swing at the drain terminal of transistor M2. On the other hand, by setting $V_{Bias1}$ and $V_{Bias2}$ such that the gate-to-source voltage of the input transistor M1 are, respectively, smaller than a threshold voltage, Vth, of the input transistor M1, no current flows through the amplifier (100) and therefore no amplification is provided. A person skilled in the art is well aware of implementation designs of biasing circuits for generating the biasing voltages $V_{Bias1}$ and $V_{Bias2}$ for operation according to the two modes while considering, for example, amplifier (100) performance during the active mode, power consumption during the inactive mode, voltage compliance of the transistors during both the active mode and the inactive mode, and current-voltage characteristics of the transistors of the stack as provided, for example, by their respective I-V curves. For example, it is also possible to place the amplifier in the inactive mode by setting $V_{Bias2}$ to a low voltage such as zero volts.

During the active mode of operation of the prior art amplifier (100) of FIG. 1, the drain of the output transistor M2 carries a voltage combination of a) a DC component that can be up to a level of the supply voltage $V_{DD}$, and b) an AC component, $V_0$, whose peak voltage depends on the impedance of $L_D$, $C_{OUT}$, and the port impedance at $RF_{OUT}$ at the frequency of operation. Accordingly, a drain-to-gate voltage, $V_{DG\_M2}$, of the common-gate cascode transistor M2 can be provided by the expression: $V_{DG\_M2}=(V_{DD}-V_{Bias2})+V_0$. Because $V_{Bias2}$ is typically close to $V_{DD}$, there is no substantial DC component during the active mode of operation and therefore $V_{DG\_M2}$ is dominated by the AC component, $V_0$. On the other hand, during the inactive mode of operation, there is no AC component at the drain of the output transistor M2, and therefore the drain of the output transistor M2 only carries the DC component that can be up to the level of the supply voltage $V_{DD}$. Accordingly, during the inactive mode of operation, the drain-to-gate voltage, $V_{DG\_M2}$, of the common-gate cascode transistor M2 can be provided by the expression: $V_{DG\_M2}=(V_{DD}-V_{Bias2})$, which in the (extreme) case where $V_{Bias2}=0$ volts, becomes $V_{DG\_M2}=V_{DD}$. Since the (peak value of the) voltage $V_0$ is typically lower than the level of the supply voltage $V_{DD}$, by selecting a type of the output transistor M2 to withstand the level of the supply voltage $V_{DD}$ across its drain and gate terminals, safe operation of the output transistor M2 during both modes of operation can be obtained. In an exemplary case where the level of the supply voltage $V_{DD}$ is about 1.2 volts, a thin-oxide transistor that can withstand voltage levels of up to 1.32 volts (e.g., maximum tolerable voltage) across any two terminals of the transistor can be used as the input transistor M1 and as the output cascode transistor M2 for improved performance (e.g., linearity, gain, noise figure) of the amplifier (100). A person skilled in the art is well aware of differences in performance provided by a thin-oxide transistor (e.g., gate oxide thickness of about 2.5 nm) as compared to a thick-oxide transistor (e.g., gate oxide thickness of about 7.5 nm) for a given fabrication process, including a better RF performance (e.g., linearity, gain, noise figure) for the thin-oxide transistor and a higher voltage tolerance for the thick-oxide transistor (e.g., about 3.4 volts).

In a multi-branch amplifier implementation where a plurality of branches similar to one shown in FIG. 1 are selectively and independently activated and/or deactivated, protection of transistors of a deactivated branch may cause performance degradation of the amplifier associated with usage of a thick-oxide transistor as a cascode transistor of the deactivated branch or usage of a supply voltage with a level that is limited to within the tolerable voltage range of a thin-oxide transistor of the deactivate branch. Teachings according to the present disclosure overcome such performance degradation.

SUMMARY

According to a first aspect of the present disclosure, a multi-branch cascode amplifier is presented, the multi-branch cascode amplifier comprising: a plurality of stacked cascode amplifier branches, each branch comprising a common-source input transistor and one or more common-gate cascode transistors comprising an output transistor, a first branch of the plurality of stacked cascode amplifier branches configured to operate according to an ON state for amplification of an input RF signal coupled to the input transistor of the first branch, and an OFF state for no amplification of the input RF signal; and a protection circuit coupled to the first branch, the protection circuit comprising: a first switching arrangement in series connection between a drain of the output transistor of the first branch and a common output node of the multi-branch cascode amplifier; and a second switching arrangement coupled to the drain of the output transistor of the first branch, wherein: during the OFF state of the first branch and an ON state of one or more other branches of the plurality of stacked cascode amplifier branches, the first switching arrangement is configured to selectively decouple the drain of the output transistor of the first branch from the common output node, and the second switching arrangement is configured to selectively couple a reference voltage to the drain of the output transistor of the first branch to maintain operation of the input transistor and the one or more cascode transistors of the first branch within their respective maximum tolerable voltages.

According to a second aspect of the present disclosure, a multi-branch cascode amplifier is presented, the multi-branch cascode amplifier comprising: a plurality of stacked cascode amplifier branches, each branch comprising a plurality of transistors coupled between a common output node of the multi-branch cascode amplifier and a reference ground, at least one branch of the plurality of stacked cascode amplifier branches configured to operate according to an ON state for amplification of an input RF signal to the at least one branch, and an OFF state for no amplification of the input RF signal, a protection circuit coupled to the at least one branch, the protection circuit comprising: a first switching arrangement in series connection with the plurality of transistors of the at least one branch; and a second switching arrangement coupled to the at least one branch, wherein: during the OFF state of the at least one branch and an ON state of one or more other branches of the plurality of stacked cascode amplifier branches, the first switching arrangement is configured to decouple a low-side segment of the at least one branch from the common output node thereby providing a high-side segment of the at least one branch that is coupled to the common output node, wherein the plurality of transistors of the at least one branch are included in a combination of the low-side and the high-side segments of said branch, and the second switching arrangement is configured to selectively couple a low-side reference voltage to the low-side segment and a high-side reference voltage to the high-side segment to maintain operation of the plurality of transistors of the at least one branch within their respective maximum tolerable voltages.

According to a third aspect of the present disclosure, a method for turning OFF a branch of a multi-branch cascode amplifier is presented, the method comprising: i) turning ON a plurality of branches of the multi-branch cascode amplifier by: providing to each branch of the plurality of branches respective gate biasing voltages to transistors of the branch for operation of the branch as an amplifier during a respective ON state of the branch, the transistors of the branch comprising a common-source input transistor and one or more common-gate cascode transistors; and based on the providing, outputting an amplified signal at a common output node of the multi-branch cascode amplifier; and ii) turning OFF at least one branch of the plurality of branches by: decoupling the at least one branch from the common output node via a first switching arrangement, thereby obtaining a decoupled branch, and coupling a reference voltage to a drain node of an output transistor of the decoupled branch via a second switching arrangement, thereby maintaining operation of the transistors of the decoupled branch within their respective maximum tolerable voltages.

According to a fourth aspect of the present disclosure, a method for turning OFF a branch of a multi-branch cascode amplifier, the method comprising: turning ON a plurality of branches of the multi-branch cascode amplifier, each branch comprising a plurality of transistors coupled between a common output node of the multi-branch cascode amplifier and a reference ground; and turning OFF at least one branch of the plurality of branches by: decoupling a low-side segment of the at least one branch from the common output node via a first switching arrangement, based on the decoupling, obtaining a high-side segment of the at least one branch that is coupled to the common output node, wherein the transistors of said branch are shared between the low-side and the high-side segments, and selectively coupling a low-side reference voltage to the low-side segment and a high-side reference voltage to the high-side segment, thereby maintaining operation of the transistors of the at least one branch within their respective maximum tolerable voltages.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 3B shows an equivalent representation of the configuration of FIG. 3A for a case of a turned ON branch.

FIG. 3C shows an equivalent representation of the configuration of FIG. 3A for a case of a turned OFF branch.

FIG. 4A shows another configuration of a branch of a multi-branch cascode amplifier according to an embodiment of the present disclosure, including a protection circuit.

FIG. 4B shows yet another configuration of a branch of a multi-branch cascode amplifier according to an embodiment of the present disclosure, including a protection circuit.

FIG. 6A shows a transistor-based switching arrangement according to an embodiment of the present disclosure that may be used in the protection circuit according to the present disclosure.

FIG. 6B shows a representation of the transistor-based switching arrangement of FIG. 6A for a case of a turned ON branch.

FIG. 6C shows a representation of the transistor-based switching arrangement of FIG. 6A for a case of a turned OFF branch.

FIG. 8A is a process chart showing various steps of a method according to the present disclosure for turning OFF a branch of a multi-branch cascode amplifier.

Like reference numbers and designations in the various drawings indicate like elements.

DETAILED DESCRIPTION

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

The protection circuit according to the present teachings may be used to protect any branch of a multi-branch amplifier, including a branch consisting of a thin-oxide input transistor and one or more thin-oxide cascode transistors used for amplification of an RF signal through the branch. Accordingly, since no thick-oxide transistors are used for amplification through the branch, improved performance (e.g., linearity, gain, noise figure) of the branch, and therefore of the multi-branch amplifier, may be obtained when compared to a multi-branch amplifier using some of the protection circuits described above.

The protection circuit according to the present teachings may be used to protect any branch of a multi-branch amplifier that is powered by a supply voltage having a voltage level substantially higher than a tolerable voltage of constituent thin-oxide transistors. Accordingly, increased level of amplification, including a 1 dB compression point (P1 dB), may be provided by the multi-branch amplifier when compared to a multi-branch amplifier using some of the protection circuits described above. The protection circuit according to the present disclosure allows operation of the multi-branch amplifier from a supply voltage higher than the tolerable voltage of the constituent thin-oxide transistors to a supply voltage that is lower than the tolerable voltage with minimum effect on performance of the amplifier.

Figure 1:
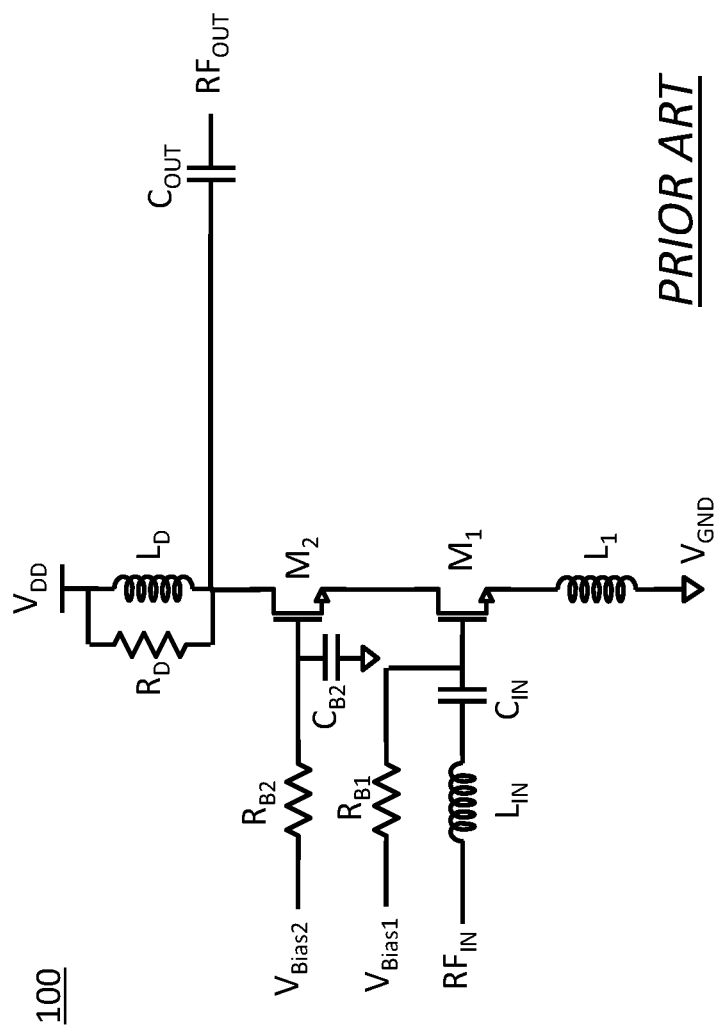
FIG. 1 shows a prior art configuration of a stacked transistor amplifier.
Figure 2A:
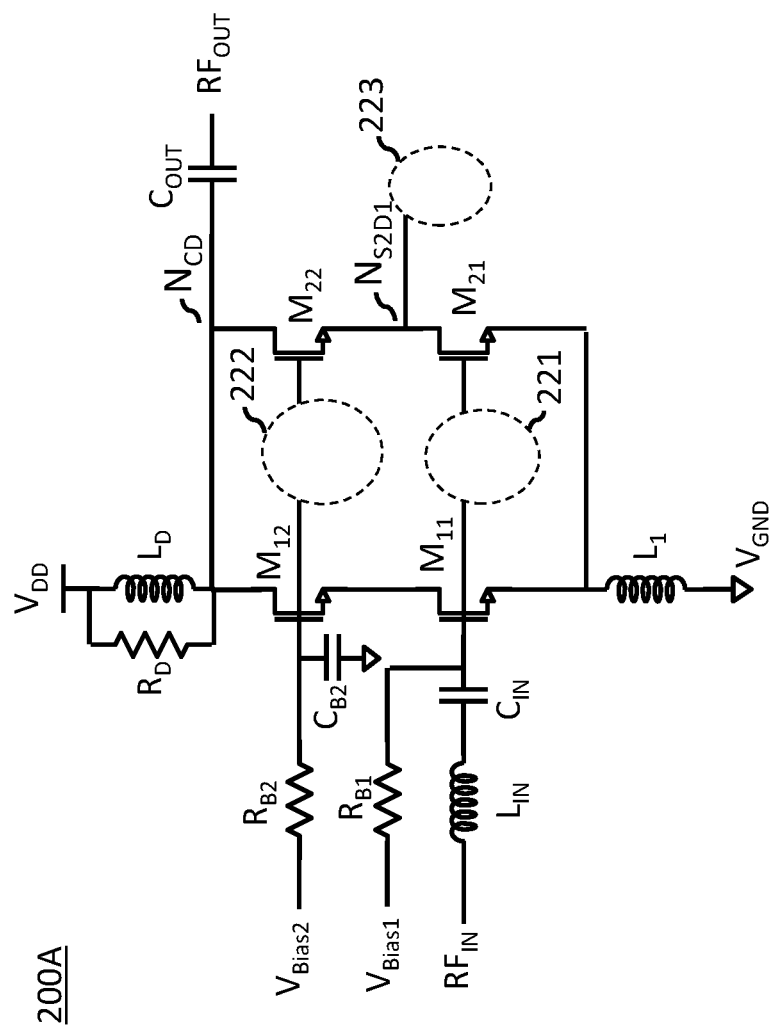
FIG. 2A shows a configuration of a multi-branch cascode amplifier including switching arrangements for protection of a branch.

FIG. 2A shows a configuration of a branched (multi-branch) cascode amplifier (200A) comprising a plurality (e.g., two) of branches, (M11, M12) and (M21, M22), each branch comprising a stacked cascode amplifier similar to the amplifier (100) of FIG. 1. As can be seen in FIG. 2A, DC blocking capacitors $C_{IN}$ couples the input RF signal, $RF_{IN}$, to a respective input transistor M11 and M21 (e.g., through a switching arrangement 221) of each of the branches, (M11, M12) and (M21, M22), and a matching (and DC blocking) capacitor, $C_{OUT}$, matches the impedance seen at the at a common (output) node, $N_{CD}$, that is common to drain nodes of the cascode output transistors M12 and M22, to the impedance seen at the $RF_{OUT}$ port, and couples the AC voltage swing, $V_O$, at the common node, $N_{CD}$, to the output port. Switching arrangements (221, 222, 223) coupled to the branch (M21, M22) allow control of the branch for operation according to an active state (branch amplifies, branch is active, branch is activated, branch is ON, ON state) and an inactive state (branch does not amplify, branch is inactive, branch is deactivated, branch is OFF, OFF state) while protecting transistors M21 and M22 in the inactive state from voltage levels higher than tolerable voltage levels (e.g., higher than a maximum tolerable voltage) of the transistors (M21, M22) with reduced impact on the performance of other active branches (e.g., M11, M12). A person skilled in the art understands that by activating (turning ON, ON state, enabling) or deactivating (turning OFF, OFF state, disabling) one or more branches (e.g., branch M21, M22), more or less current can flow (from supply voltage $V_{DD}$ to the reference ground $V_{GND}$) though the amplifier (200A), and therefore more or less gain can be provided by the amplifier (200A). Furthermore, as clearly understood by a person skilled in the art, current through each branch can be different and based on a size of transistors of the branch. Finally, a person skilled in the art would understand that an active mode of the amplifier (200A) can include at least one activated branch (ON state of the branch, e.g., branch M11, M12) and an inactive mode of the amplifier (200A) can include all branches being deactivated (e.g., all branches including a switching arrangement similar to one shown in FIG. 2A).

Figure 2C:
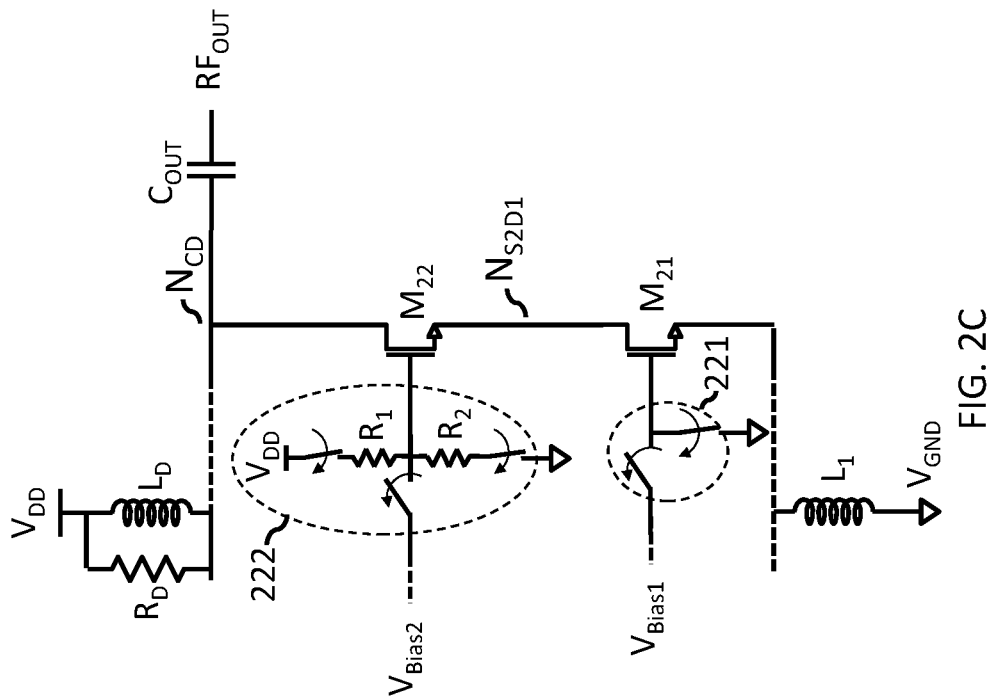
FIG. 2C shows another implementation of the switching arrangements of FIG. 2A.
Figure 2B:
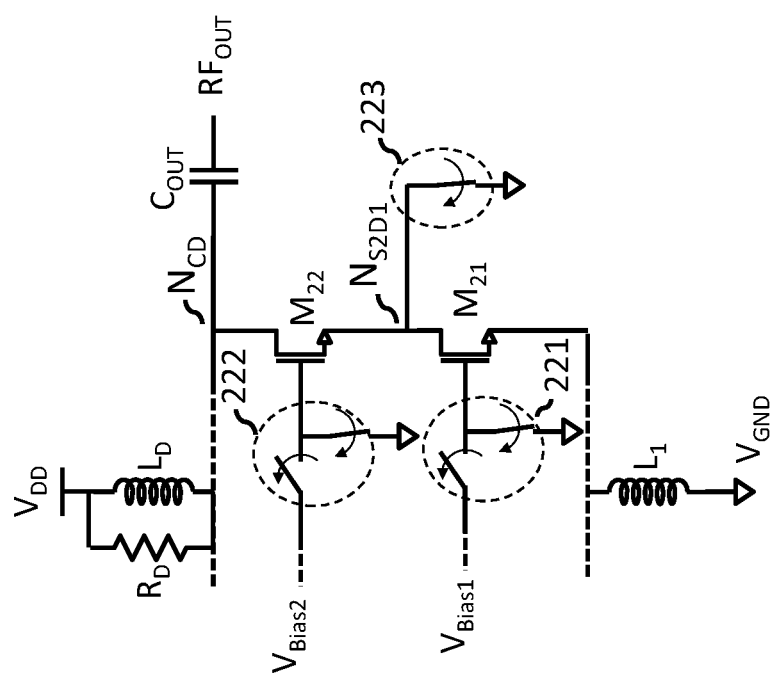
FIG. 2B shows an implementation of the switching arrangements of FIG. 2A.

FIG. 2B shows an implementation of the switching arrangements (221, 222, 223) of FIG. 2A configured during the OFF state of the branch (M21, M22). For example, in the implementation according to FIG. 2B, each switching arrangement (221, 222) coupled to a respective gate of a transistor (M21, M22) includes a series switch that can couple/decouple a respective biasing voltage ($V_{Bias1}$, $V_{Bias2}$) to the gate of the transistor (M21, M22), and a shunting switch that can couple/decouple the gate of the transistor (M21, M22) to the reference ground $V_{GND}$ (or an AC ground). Furthermore, the switching arrangement (223) coupled to a common node $N_{S2D1}$ of the source of transistor M22 and the drain of the transistor M21 includes a shunting switch that can couple/decouple the common node $N_{S2D1}$ to the reference ground (or an AC ground).

As shown in FIG. 2B, during the OFF state of the branch (M21, M22), the switching arrangements (221, 222) decouple the biasing voltage ($V_{Bias1}$, $V_{Bias2}$) from the gates of the transistors (M21, M22) and couple said gates to the reference ground, $V_{GND}$. At the same time, the switching arrangement (223) couples the common node $N_{S2D1}$, and therefore the drain of the transistor M21 and the source of the transistor M22, to the reference ground, $V_{GND}$. Accordingly, the combination of the switches (221) and (223) turn OFF the transistor M21 while limiting voltage levels at respective gate and drain nodes of the transistor M21 to zero volts (e.g., $V_{GND}$). Likewise, the combination of the switches (222) and (223) turn OFF the transistor M22 while limiting voltage levels at respective gate and source nodes of the transistor M22 to zero volts. It should be noted that in the figures of the present disclosure, direction of a curved arrow on a throw of a switch is indicative of open/close state of the switch, whereas a double arrow on a throw is indicative of available selection for open/close state of the switch.

In contrast to the prior art (single branch) configuration of FIG. 1, in the (multi-branch) configuration shown in FIG. 2B, a drain node (i.e., $N_{CD}$) of an output cascode transistor (e.g., M22) of a deactivated (i.e., turned OFF, inactive) branch may still see an AC component corresponding to an amplified RF signal through an active branch. Accordingly, using the previously described expression of the drain-to-gate voltage to the turned OFF branch (M21, M22) shown in FIG. 2B, one gets: $V_{DG\_M22}=(V_{DD}-V_{G\_M22})+V_0$, and since $V_{G\_M22}=0$ volts (e.g., gate of M22 coupled to the reference ground as shown in FIG. 2B) in the deactivated state of the branch (M21, M22), then $V_{DG\_M22}=V_{DD}+V_0$, which may represent a voltage level higher than a (maximum) voltage tolerable by the transistor M22 Likewise, the drain-to-source voltage $V_{DS\_M22}$ in the deactivated state of the branch (M21, M22) may be also equal to $V_{DD}+V_0$. One solution for overcoming such problem of potentially subjecting the transistor M22 to higher voltage levels during the OFF state of the branch (M21, M22) may be to use a thick-oxide transistor with an inherently higher maximum tolerable voltage as the (cascode) transistor M22 (or any other output transistor, e.g., M12). However, as described above, such thick-oxide transistor may degrade performance of the amplifier (200A), especially at lower supply voltages, $V_{DD}$. Another possible solution is shown in the configuration of FIG. 2C, wherein the output transistor M22, a thin-oxide transistor, is protected from the higher voltage levels during the OFF state of the branch (M21, M22) by setting the gate voltage of the output transistor M22 to a voltage higher than zero volts, thereby reducing the drain-to-gate and drain-to-source voltages of the output transistor M22 in the OFF state of the branch (e.g., M21, M22 of FIG. 2C).

As shown in the configuration of FIG. 2C, the switching arrangement (222) may include a (switchable) resistive ladder ($R_1$, $R_2$) that can be coupled to the gate of the transistor M22 during the OFF state of the branch (M21, M22) and decoupled from the gate of the transistor M22 during the ON state of the branch. Coupling and decoupling of the resistive ladder ($R_1$, $R_2$) may be provided via series switches that respectively couple and decouple each resistor ($R_1$, $R_2$) to a supply voltage (e.g., $V_{DD}$) and the reference ground (thereby allowing a current flow through the series-connected resistors). For example, during the OFF state of the branch (M21, M22) shown in FIG. 2C, the biasing voltage to the gate of the transistor M22 is provided by the resistive ladder ($R_1$, R2). Such biasing voltage can be selected in view of the voltage at the node Nap such as to protect the transistor M22 from a voltage level that is higher than its (maximum) tolerable voltage range. This may include dropping a voltage level up to the supply voltage level, $V_{DD}$, across any two terminals (i.e., drain, gate, source) of the transistor M22. Accordingly, the configuration shown in FIG. 2C may allow usage of a (higher performance) thin-oxide transistor as the output cascode transistor M22 so long the supply voltage $V_{DD}$ is not larger than the tolerable voltage of the (thin-oxide) transistor M22. Furthermore, while the input transistor (e.g., M21) of a turned OFF branch is turned OFF (e.g., gate is biased at zero volts as shown in FIG. 2C), since the gate of the output transistor M22 is still biased at a voltage higher than zero volts, the output transistor may leak current and consequently degrade the performance of the amplifier (e.g., 200A of FIG. 2A), including linearity, gain, and noise figure, as provided by other active branches.

Figure 3A:
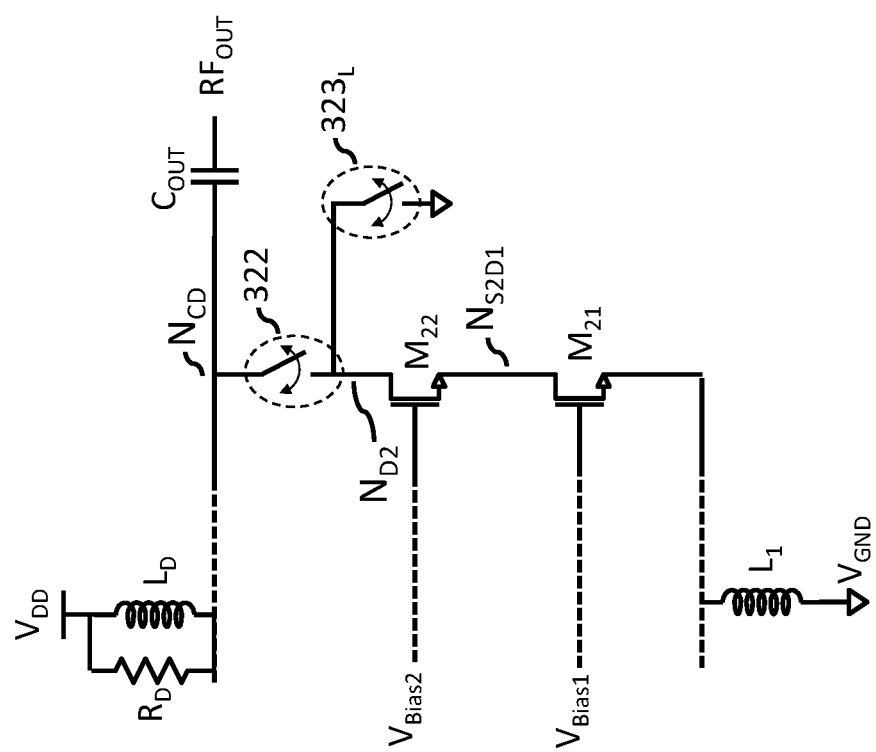
FIG. 3A shows a configuration of a branch of a multi-branch cascode amplifier according to an embodiment of the present disclosure, including a protection circuit.

FIG. 3A shows a configuration of a branch (M21, M22) of a multi-branch cascode amplifier (e.g., FIG. 5B later described) according to an embodiment of the present disclosure, including the protection circuit (322, $323_L$). As can be seen in FIG. 3A, the protection circuit (322, $323_L$) according to the present disclosure comprises a first switching arrangement (322) that is in series-connection with the transistors (e.g., M21, M22) of the branch, and a second switching arrangement ($323_L$) coupled to a node that is common to a transistor (e.g., M22) of the branch and the first switching arrangement (322). In other words, the first switching arrangement (322) and the plurality of transistors (e.g., M21, M22) of the branch (M21, M22) are arranged in series connection, so that when a current flows through the branch, it flows through the first switching arrangement (322) and through the plurality of transistors (e.g., M21, M22).

With further reference to FIG. 3A, according to an embodiment of the present disclosure, the first switching arrangement (322) is configured to selectively open or close a conduction path for an amplification current through the branch. According to an embodiment of the present disclosure, the first switching arrangement (322) may be coupled between the common (output) node, $N_{CD}$, of the multi-branch amplifier, and the drain, $N_{D2}$, of the output cascode transistor M22 of the branch (M21, M22). In other words, a first (high-side) terminal of the first switching arrangement (322) is coupled to the common node, $N_{CD}$, and a second (low-side) terminal of the first switching arrangement (322) is coupled to the drain, $N_{D2}$. Accordingly, opening or closing of the conduction path for the amplification current through the branch may include controlling of the first switching arrangement (322) to respectively decouple or couple the first (high-side) terminal from/to the second (low-side) terminal of the first switching arrangement (322). In other words, with reference to the configuration of FIG. 3A, opening or closing of the conduction path for the amplification current through the branch may include controlling of the first switching arrangement (322) to respectively decouple or couple the drain, $N_{D2}$, of the output cascode transistor M22 from/to the common node, $N_{CD}$.

With continued reference to FIG. 3A, according to an embodiment of the present disclosure, the second switching arrangement ($323_L$) may selectively couple or decouple the drain node, $N_{D2}$, of the output cascode transistor, M22, to a reference voltage, such as, the reference ground, $V_{GND}$. In other words, the second switching arrangement ($323_L$) may selectively limit a voltage level coupled to the transistors of the branch (M21, M22) during the OFF state of the branch, and therefore protect said transistors from a voltage level higher than their tolerable voltage ranges. It is noted that the reference voltage may be based on a voltage coupled to the transistors of the branch (e.g., M21, M22) when the first switching arrangement (322) decouples the transistors from the common node, $N_{CD}$, and therefore from the supply voltage, $V_{DD}$. For example, in the configuration shown in FIG. 3A, such coupled voltage may be the reference voltage, $V_{GND}$. As described later with reference to FIGS. 4A and 4B, location of the first switching arrangement (322) in the branch may yield in different segments of the branch coupled to different voltages (e.g., $V_{DD}$ or $V_{GND}$) when the first switching arrangement (322) is open, and accordingly overvoltage protection for each of the branches may be based on a different reference voltage.

According to an embodiment of the present disclosure, as shown in FIG. 3A, biasing voltages (e.g., $V_{Bias1}$, $V_{Bias2}$) to gates of the transistors of the branch (M21, M22) may remain fixed during operation of the branch in either its ON state or OFF state. In other words, no switching of levels of the biasing voltages (e.g., $V_{Bias1}$, $V_{Bias2}$) may be required. Fixing of the biasing voltages is made possible by the combined effect of the switching arrangements (322) and ($323_L$) which are configured to deactivate amplification (i.e., current flow) through the branch while protecting constituent thin-oxide transistors (M21, M22).

FIG. 3B shows an equivalent representation of the configuration of FIG. 3A for a case of a turned ON branch (M21, M22). As can be seen in FIG. 3B, when the branch (M21, M22) is turned ON, the first switching arrangement (322) closes a conduction path for the amplification current $I_{D2}$ through the branch (M21, M22), while the second switching arrangement ($323_L$) is open and therefore decouples the reference voltage (e.g., $V_{GND}$) from the node $N_{D2}$ It is noted that in the closed configuration, the first switching arrangement (322) is configured to operate as a sufficiently low resistance (e.g., ON resistance, $R_{ON}$, of a switch) conduction path, and therefore quasi transparent to the amplification process through the branch (M21, M22). In other words, in the closed configuration, a voltage drop across the two terminals (high-side, low-side) of the first switching arrangement (322) respectively coupled to the nodes $N_{CD}$ and $N_{D2}$ is very low and therefore an operating headroom of the transistors M21 and M22 is substantially maintained in spite of presence of the inline series-connected first switching arrangement (322).

On the other hand, as can be seen in FIG. 3B, when the first branch (M21, M22) is turned ON, the second switching arrangement ($323_L$) is open and therefore decouples the reference voltage (e.g., $V_{GND}$) from the node $N_{D2}$ It is noted that in the open configuration, the second switching arrangement ($323_L$) is configured to operate as a sufficiently low value capacitance (e.g., OFF capacitance, $C_{OFF}$, of a switch) such as to not affect a voltage at the node $N_{D2}$ at frequencies of operation. Furthermore, it is noted that in the ON state of the branch (M21, M22) shown in FIG. 3B, the second switching arrangement ($323_L$) must withstand a voltage drop that may be equal to a voltage at the node $N_{D2}$ Since the voltage at the node $N_{D2}$ may be substantially equal to the voltage at the node $N_{CD}$, it follows that the second switching arrangement ($323_L$) must withstand a voltage drop that can be equal to or higher than the supply voltage $V_{DD}$.

FIG. 3C shows an equivalent representation of the configuration of FIG. 3A for a case of a turned OFF branch (M21, M22). As can be seen in FIG. 3C, when the branch (M21, M22) is turned OFF, the first switching arrangement (322) opens the conduction path provided for the amplification current $I_{D2}$ through the ON branch (M21, M22), while the second switching arrangement ($323_L$) is closed and therefore couples the reference voltage (e.g., $V_{GND}$) to the node $N_{D2}$ It is noted that in the open configuration, the first switching arrangement (322) is configured to operate as a sufficiently low value capacitance (e.g., OFF capacitance, $C_{OFF}$, of a switch) such as to not affect a voltage at the node $N_{CD}$ at frequencies of operation. Furthermore, it is noted that in the OFF state of the branch (M21, M22) shown in FIG. 3C, the first switching arrangement (322) must withstand a voltage drop that may be equal to a voltage at the node $N_{CD}$. It follows that the first switching arrangement (322) must withstand a voltage drop that can be equal to or higher than the supply voltage $V_{DD}$.

On the other hand, as can be seen in FIG. 3C, when the first branch (M21, M22) is turned OFF, the second switching arrangement ($323_L$) is closed and therefore couples the reference voltage (e.g., $V_{GND}$) to the node $N_{D2}$ It is noted that in the open configuration, the second switching arrangement ($323_L$) is configured to operate as a sufficiently low resistance (e.g., ON resistance, $R_{ON}$, of a switch) conduction path that couples the reference voltage (e.g., $V_{GND}$) to the node $N_{D2}$.

A person skilled in the art would know of many implementation designs of a (single-pole single-throw) switch that may be used as the first or the second switching arrangements (322, 323$_L$), including an electromechanical switch, a MEMS switch, a semiconductor switch, a transistor switch, or any other switch configuration known to a person skilled in the art that can provide a sufficiently low ON resistance, R$_{ON}$, when the switch is closed, and a sufficiently low OFF capacitance, C$_{OFF}$, when the switch is open. However, it should be noted that since the first switching arrangement (322) may be: 1) coupled to (or connected to) the node, N$_{CD}$, which is a node common to all the branches of the multi-branch amplifier in the OFF state of the branch, and 2) part of a conduction path for the amplification current in the ON state of the branch, characteristics of the first switching arrangement (322), including RF and DC characteristics, may be more critical to ones of the second switching arrangement (323$_L$) with respect to the overall performance of the multi-branch amplifier. Accordingly, design requirements for the first switching arrangement (322) may be more stringent, such as provided by the various embodiments of the present disclosure with reference to FIGS. 6A-6C and 7A-7B later described.

FIG. 4A shows another configuration of a branch (M21, M22) of a multi-branch cascode amplifier (e.g., FIG. 5B later described) according to an embodiment of the present disclosure, including a protection circuit (322, 323$_H$, 323$_L$). As can be seen in FIG. 4A, the protection circuit (322, 323$_H$, 323$_L$) according to the present disclosure may comprise a first switching arrangement (322) that is in series-connection with the transistors (e.g., M21, M22) of the branch, and a second switching arrangement (323$_H$, 323$_L$), comprising switching elements (323$_H$) and (323$_L$), coupled to respective nodes that are common to transistors (e.g., M21, M22) of the branch and the first switching arrangement (322). In particular, as can be seen in FIG. 4A, the first switching arrangement (322) is in series-connection with, and arranged between, the transistors M21 and M22. Accordingly, a first (high-side) terminal of the first switching arrangement (322) is coupled to a source node, N$_{S2}$, of the cascode transistor M22, and a second (low-side) terminal of the first switching arrangement (322) is coupled to a drain node, N$_{D1}$, of the input transistor M21. Operation of the first switching arrangement (322) being substantially same as one described with reference to FIGS. 3A-3C. It is noted that FIG. 4A shows configuration for the OFF state of the branch (M21, M22).

With continued reference to FIG. 4A, the switching elements (323$_H$) and (323$_L$) of the second switching arrangement (323$_H$, 323$_L$) are configured to selectively couple or decouple respective reference voltages (e.g., V$_{DD}$ and V$_{GND}$) to the nodes N$_{S2}$ and N$_{D1}$ in a manner similar to one described above for the second switching arrangement (323$_L$) with reference to FIGS. 3A-3C. It is noted that when the first switching arrangement (322) is open, the location of the first switching arrangement (322) in the branch (M21, M22) shown in FIG. 4A yields in a high-side segment of the branch (comprising M22) coupled to the supply voltage, V$_{DD}$, and a low-side segment of the branch (comprising M21) coupled to the reference voltage, V$_{GND}$, and therefore, overvoltage protection for each of the branches as provided by the second switching arrangement (323$_H$, 323$_L$) may be based on a different reference voltage (e.g., V$_{DD}$ for the high-side segment and V$_{GND}$ for the low-side segment).

FIG. 4B shows another configuration of a branch (M21, M22) of a multi-branch cascode amplifier (e.g., FIG. 5B later described) according to an embodiment of the present disclosure, including a protection circuit (322, 323$_H$). As can be seen in FIG. 4B, the protection circuit according to the present disclosure comprises a first switching arrangement (322) that is in series-connection with the transistors (e.g., M21, M22) of the branch, and a second switching arrangement (323$_H$) coupled to a node that is common to a transistor (e.g., M21) of the branch and the first switching arrangement (322). In particular, as can be seen in FIG. 4B, the first switching arrangement (322) is in series-connection with the transistors M21 and M22 and arranged between the input transistor M21 and the reference ground, V$_{GND}$. Accordingly, a first (high-side) terminal of the first switching arrangement (322) is coupled to a source node, Ns 1, of the input transistor M21, and a second (low-side) terminal of the first switching arrangement (322) is coupled to the reference ground, V$_{GND}$ (e.g., via inductor L$_1$). Operation of the first switching arrangement (322) being substantially same as one described with reference to FIGS. 3A-3C. It is noted that FIG. 4B shows configuration for the OFF state of the branch (M21, M22).

With continued reference to FIG. 4B, the switching arrangement (323$_H$) is configured to selectively couple or decouple a reference voltage (e.g., V$_{DD}$) to the nodes N$_{S1}$ in a manner similar to one described above for the second switching arrangement (323$_L$) with reference to FIGS. 3A-3C. It is noted that when the first switching arrangement (322) is open, the location of the first switching arrangement (322) in the branch (M21, M22) shown in FIG. 4B yields in a high-side segment of the branch (comprising M21 and M22) coupled to the supply voltage, V$_{DD}$, and a low-side segment of the branch (comprising no transistors) coupled to the reference voltage, V$_{GND}$, and therefore, overvoltage protection, only required for a segment including at least one transistor, may be provided to the high-side segment of the branch by the second switching arrangement (323$_H$) based on a reference voltage that is substantially equal to the supply voltage, V$_{DD}$.

Based on the above, a person skilled in the art will clearly understand that protection according to the present teachings may be provided by 1) a first switching arrangement (e.g., 322) that is in series-connection with the transistors (e.g., M21, M22) of the branch, the first switching arrangement (e.g., 322) arranged such as to define a first (high-side) segment of the branch coupled between a first (high-side) terminal of the first switching arrangement and the supply voltage V$_{DD}$ (e.g., common node N$_{CD}$), and a second (low-side) segment of the branch coupled between a second (low-side) terminal of the first switching arrangement (e.g., 322) and the reference ground, V$_{GND}$, and 2) a second switching arrangement (e.g. 323$_H$, 323$_L$) that includes switching elements (e.g. 323$_H$, 323$_L$) that selectively couple/decouple respective reference voltages (e.g., V$_{DD}$, V$_{GND}$,) to the first (high-side) and second (low-side) terminals of the first switching arrangement (e.g., 322) when the first (high-side) and second (low-side) segments include at least one transistor of the branch (e.g., M21, M22).

In other words, based on the inline position of the first switching arrangement (322) within the branch (M21, M22), the first switching arrangement (322) may define, 1) at a first (high-side) terminal of the first switching arrangement (322), a first (high-side) segment of the branch coupled to V$_{DD}$ that includes no transistors (per FIG. 3A) or one or more transistors (per FIGS. 4A and 4B), and 2) at a second (low-side) terminal of the first switching arrangement (322), a second (low-side) segment of the branch coupled to V$_{GND}$ that includes no transistors (per FIG. 4B) or one or more transistors (per FIGS. 3A and 4A). Therefore, when the first (high-side) segment includes at least one transistor, the protection circuit includes a second (high-side) switching element (e.g., 323$_H$ of FIGS. 4A and 4B) that selectively couples/decouples a reference voltage that is substantially equal to the supply voltage, $V_{DD}$, to the first (high-side) terminal of the first switching arrangement (322), and when the second (low-side) segment includes at least one transistor, the protection circuit includes a second (low-side) switching element (e.g., $323_L$ of FIGS. 3A and 4A) that selectively couples/decouples a reference voltage that is substantially equal to the reference ground, $V_{GND}$, to the second (low-side) terminal of the first switching arrangement (322).

Figure 5B:
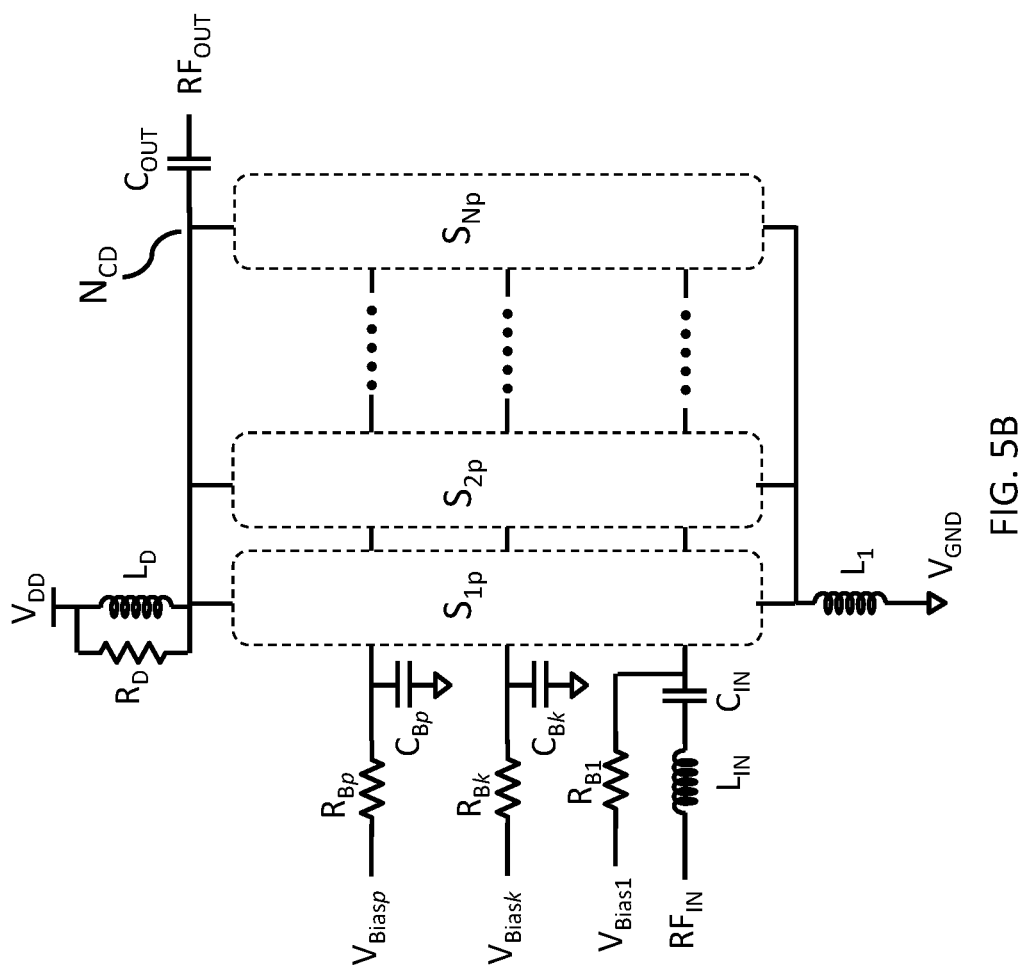
FIG. 5B shows a configuration of a multi-branch cascode amplifier according to an embodiment of the present disclosure comprising a plurality of branches, each branch including a protection circuit.
Figure 5A:
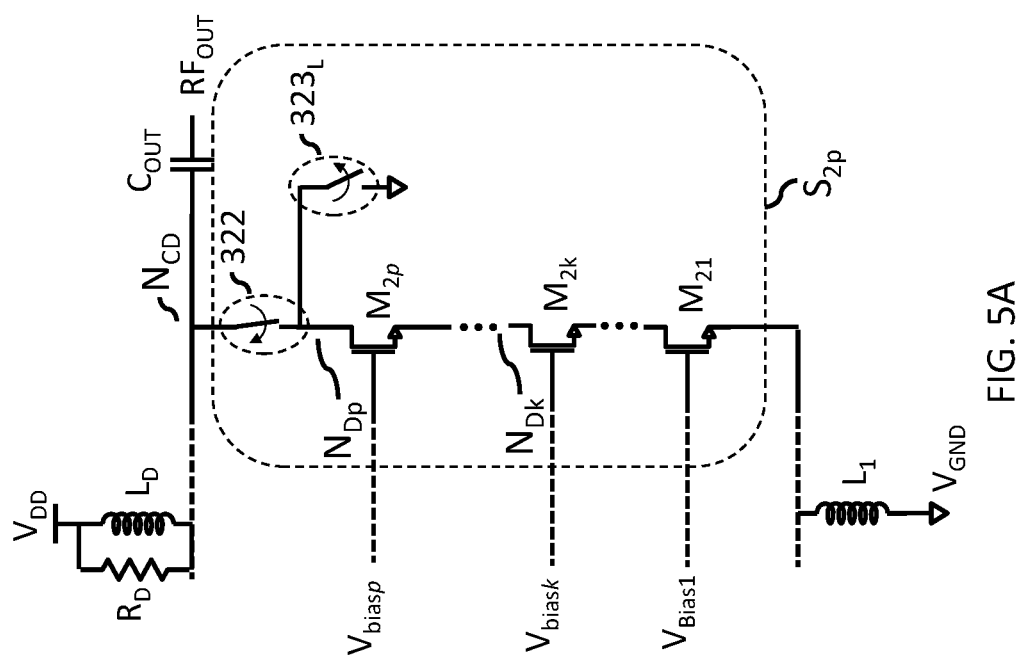
FIG. 5A shows a configuration of a branch of a multi-branch cascode amplifier according to an embodiment of the present disclosure based on the configuration of FIG. 3A.

FIG. 5A shows a configuration of a (protected) branch $S_{2p}$ of a multi-branch cascode amplifier according to an embodiment of the present disclosure based on the configuration of FIG. 3A. As shown in FIG. 5A, teachings according to the present disclosure extend to a branch $S_{2p}$ comprising an input transistor M21 and one or more cascode transistors (M22, . . . , M2p), where p can be any integer equal to or greater than one. Furthermore, it is noted that the position of the first switching arrangement (322) may be according to any one position shown in FIG. 3A, 4A or 4B described above.

FIG. 5B shows a configuration of a multi-branch cascode amplifier according to an embodiment of the present disclosure comprising a plurality N of branches ($S_{1p}$, $S_{2p}$, . . . , $S_{Np}$), N being an integer equal to or greater than two. In the configuration shown in FIG. 5B, each branch ($S_{1p}$, $S_{2p}$, . . . , $S_{Np}$) may be a protected branch according to FIG. 5A, comprising a same number p of transistors (i.e., one input transistor and (p−1) cascode transistors). Operation of the multi-branch cascode amplifier shown in FIG. 5B may be based on an inactive state wherein all of the branches ($S_{1p}$, $S_{2p}$, . . . , $S_{Np}$) are OFF, and on at least one active state wherein one or more of the branches ($S_{1p}$, $S_{2p}$, . . . , $S_{Np}$) are ON. It is noted that more than one active state may be provided by turning ON different combinations of the branches ($S_{1p}$, $S_{2p}$, . . . , $S_{Np}$) to obtain, for example, a different gain setting of the multi-branch cascode amplifier. Furthermore, it is noted that while all or some of the branches ($S_{1p}$, $S_{2p}$, . . . , $S_{Np}$) may include the protection circuit according to the present teachings, not all branches may necessarily include the same configuration, as any of the branches ($S_{1p}$, $S_{2p}$, . . . , $S_{Np}$) may be protected according to any of the configurations of FIG. 3A, 4A or 4B. Finally, as previously described, although according to some embodiments all branches may have a same number p of transistors, transistors of different branches may have different characteristics, such as, for example, different sizes or different types. According to other embodiments, different branches may have different number of transistors (e.g., p is different for at least two branches) and transistors of different branches may have different characteristics, such as, for example, different sizes, threshold voltages, or implant definitions. Finally, the multi-branch cascode amplifier shown in FIG. 5B may operate from different levels of the supply voltage, $V_{DD}$, including a high level that is higher than a tolerable voltage of the thin-oxide transistors of the branches ($S_{1p}$, $S_{2p}$, . . . , $S_{Np}$), down to a low level that is lower than the tolerable voltage of the thin-oxide transistors of the branches ($S_{1p}$, $S_{2p}$, . . . , $S_{Np}$), while maintaining substantially same performance (e.g., linearity, gain, noise figure) of the amplifier. For example, considering thin-oxide transistors having a gate oxide thickness of about 2.5 nm and a maximum tolerable voltage of 1.32 volts, the high level of the supply voltage may be about 3.4 volts and the low level of the supply voltage may be about 1.2 volts. As described later with reference to FIG. 6A, the high level may be based on a tolerable/withstand voltage of the first switching arrangement (e.g., 322).

FIG. 6A shows a transistor-based switching arrangement (622) according to an embodiment of the present disclosure that may be used as the first switching arrangement (322) of the protection circuit according to the present disclosure (e.g., FIGS. 3A, 4A, 4B). The transistor-based switching arrangement (622) provides increased RF and DC performance compared to known in the art transistor-based switches which can therefore improve overall performance (e.g., linearity, gain, noise figure) of a multi-branch cascode amplifier (e.g., FIG. 5B) when used in a protection circuit of a branch. Furthermore, ON and OFF control of the transistor-based switching arrangement (622) may be based on simple switching of a voltage level from a high state to a low state (and vice versa).

With continued reference to FIG. 6A, the transistor-based switching arrangement (622) is operable as a single-pole single-throw switch between terminals (nodes) $N_{322H}$ and $N_{322L}$. In the ON state, the transistor-based switching arrangement (622) provides a low resistance conduction path between the two terminals $N_{322H}$ and $N_{322L}$, and in the OFF state provides a high impedance (at a frequency of operation) between the two terminals. ON and OFF states of the transistor-based switching arrangement (622) may be based on a combination of a voltage level of a biasing voltage, $V_{BiasT1}$, and an ON and OFF state of a single-pole single-throw shunting switch $S_1$.

As shown in FIG. 6A, the transistor-based switching arrangement (622) comprises a transistor $T_1$ whose drain, $D_1$, provides (is coupled/connected to) the terminal $N_{322H}$ and source, $S_1$, provides the terminal $N_{322L}$. Furthermore, the gate, $G_1$, of the transistor $T_1$ is coupled to the biasing voltage, $V_{BiasT1}$, through a series-connected gate resistor, $R_{G1}$. The shunting switch $S_1$, also coupled to the gate, $G_1$, of the transistor $T_1$, allows further control of a voltage at the gate $G_1$. For example, when the shunting switch $S_1$ is open, voltage at the gate $G_1$ is based on the voltage level of the biasing voltage, $V_{BiasT1}$, and when the shunting switch $S_1$ is closed, voltage at the gate $G_1$ is zero volts (gate is grounded) irrespective of the voltage level of a biasing voltage, $V_{BiasT1}$.

According to an embodiment of the present disclosure, the transistor $T_1$ shown in FIG. 6A is a thick-oxide transistor having a maximum tolerable voltage (e.g., about 3.4 volts) that is substantially greater than the maximum tolerable voltage (e.g., about 1.3 volts) of the thin-oxide transistors (e.g., M21, M22, . . . ) used in the protected branches according to the present disclosure (e.g., FIGS. 3A, 4A, 4B). Size of the transistor $T_1$ may be in view of a tradeoff between a desired ON resistance ($R_{ON}$) and OFF capacitance ($C_{OFF}$) of the transistor $T_1$. As shown in FIG. 6A, the transistor $T_1$ includes internal parasitic capacitances, including a gate-to-drain capacitance ($C_{GD}$) and a gate-to-source capacitance ($C_{GS}$).

According to an embodiment of the present disclosure, the transistor $T_1$ is biased for operation according to a switch, including an ON state wherein the drain, $D_1$, and source, $S_1$, are coupled through the ON resistance of the transistor $T_1$, and an OFF state wherein the drain, $D_1$, and source, $S_1$, are coupled through the OFF capacitance of the transistor $T_1$.

As shown in FIG. 6B, biasing for the ON state of the transistor $T_1$ may be provided by setting a voltage level of the biasing voltage, $V_{BiasT1}$, sufficiently high to turn ON conduction of the transistor $T_1$ (represented in FIG. 6B by $R_{ON}$) while setting the shunting switch $S_1$ to the open position. According to an embodiment of the present disclosure, conduction of the transistor $T_1$ in the ON state may be in view of operating the transistor $T_1$ in its triode region, and therefore without any active participation in generation (e.g., buffering, amplifying) of a current flowing through a conduction path between the drain, $D_1$, and the source, $S_1$, of the transistor $T_1$. It is noted that such operation of the transistor $T_1$ in its triode region is in stark contrast to operation of the thin-oxide transistors of the protected branches described above (e.g., with reference to FIGS. 3A, 4A and 4B) which are biased to operate in their respective saturation regions of operation (and therefore actively participate in generation of a current flowing through the transistors). Furthermore, in order to push operation of the transistor $T_1$ further into the triode region of operation, and therefore obtain a lower value possible of $R_{ON}$, the voltage level of the biasing voltage, $V_{BiasT1}$ may be set to as high as tolerable by the transistor $T_1$, such as for example, substantially equal to the tolerable/withstand voltage of the (thick-oxide) transistor $T_1$. Furthermore, it is noted that the shunting switch $S_1$ may also be a (thick-oxide) transistor-based switch selected to have a size small enough (and therefore small enough $C_{OFF}$) not to load the RF signal during the ON state of the transistor $T_1$.

With continued reference to FIG. 6B, according to an embodiment of the present disclosure, a size of the resistor R $G_1$ may be configured to render the gate node, $G_1$, a high impedance node when combined with the parasitic capacitances $C_{GD}$ and $C_{GS}$ of the transistor $T_1$, at a frequency of operation of the branch. Accordingly, a (capacitive) loading on an RF signal through the transistor $T_1$ when conducting (i.e., ON state) may be reduced (e.g., $V_{GS}$ RF voltage drop of $T_1$ is reduced). This in turn allows improved linearity of the transistor $T_1$ when conducting through its $R_{ON}$ equivalent resistance by removing effect of the parasitic capacitances of the transistor $T_1$. Similarly, the resistor $R_{G1}$ eliminates the capacitive loading of $C_{GD}$ and $C_{GS}$ parasitic capacitors on the nodes $N_{322H}$ and $N_{322L}$ respectively. Thus, a multi-branch amplifier such as shown in FIG. 5B using the switch embodied by the transistor-based switching arrangement (622) maintains the same gain response bandwidth relative to that of the configuration shown in FIG. 2A.

As shown in FIG. 6C, biasing for the OFF state of the transistor $T_1$ may be provided by setting the shunting switch $S_1$ to the closed position thereby grounding the gate $G_1$ of the transistor $T_1$ and turning OFF conduction of the transistor $T_1$ (represented in FIG. 6C by $C_{OFF}$). Because the gate $G_1$ of the transistor $T_1$ is shorted to ground (e.g., $V_{GND}$) when the transistor $T_1$ is turned OFF, and thereby set to a fixed/constant value irrespective of a voltage of an RF signal coupled to the drain, $D_1$, of the transistor $T_1$ (e.g., high-side terminal of the first switching arrangement (322) of FIG. 3A, 4A or 4B may be coupled to an RF signal from other active branches), then the conduction channel of $T_1$ is guaranteed to remain strongly cutoff and a loading effect of the transistor $T_1$ upon the RF signal may be reduced.

With continued reference to FIG. 6C, because the voltage level of the biasing voltage, $V_{BiasT1}$, has no effect upon state of the transistor $T_1$ in this OFF state due to $S_1$ being coupled to $V_{GND}$, such voltage level may be maintained to the same level required by the turn ON state of the transistor $T_1$, or may be switched to a lower level, such as for example, zero volts (e.g., $V_{GND}$). It is noted if such voltage level is maintained, then power may be wasted through the drop of the voltage level across the resistor $R_{G1}$.

Based on the above, a size (resistance) of the resistor $R_{G1}$ may be selected in view of a frequency of operation of the branch, a size of the parasitic capacitances of the transistor $T_1$, and optionally an allowed power dissipation through the resistor $R_{G1}$ in view of a voltage level of the biasing voltage, $V_{BiasT1}$, during the OFF state of the transistor $T_1$.

Figure 7B:
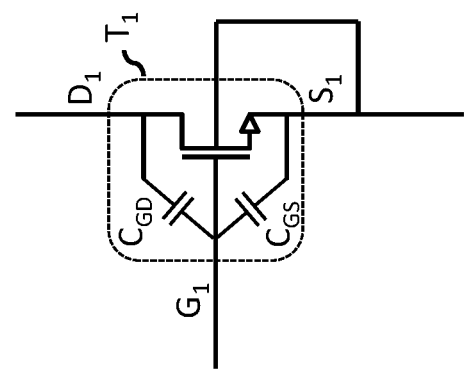
FIG. 7B shows another exemplary embodiment of a transistor configuration used in the transistor-based switching arrangement of FIG. 6A
Figure 7A:
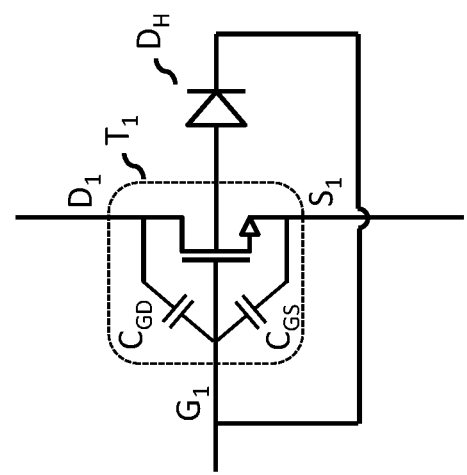
FIG. 7A shows an exemplary embodiment of a transistor configuration used in the transistor-based switching arrangement of FIG. 6A.

FIGS. 7A and 7B show exemplary embodiments according to the present disclosure of transistors that may be used as the transistor T1 described above with reference to FIGS. 6A-6C for further improvement in linearity of the transistor-based switching arrangement. As can be seen in FIGS. 7A and 7B, improvement in linearity is based on providing a conduction path to body charges accumulated in the transistor T1 used in the configurations of FIGS. 6A-6C. These include a conduction path provided by a diode, $D_H$, connected between the body and the gate, $G_1$, of the transistor $T_1$ per FIG. 7A, a conduction path provided by a short connected between the body and the source, $S_1$, of the transistor $T_1$ per FIG. 7B, or a resistive path from the body to an separate voltage reference point.

FIG. 8A is a process chart (800a) showing various steps of a method for turning OFF a branch of a multi-branch cascode amplifier. As can be seen in FIG. 8A, such steps comprise: turning ON a plurality of branches of the multi-branch cascode amplifier by: providing to each branch of the plurality of branches respective gate biasing voltages to transistors of the branch for operation of the branch as an amplifier during a respective ON state of the branch, the transistors of the branch comprising a common-source input transistor and one or more common-gate cascode transistors; and based on the providing, outputting an amplified signal at a common output node of the multi-branch cascode amplifier, per step (810a); and turning OFF at least one branch of the plurality of branches by: decoupling the at least one branch from the common output node via a first switching arrangement, thereby obtaining a decoupled branch, and coupling a reference voltage to a drain node of an output transistor of the decoupled branch via a second switching arrangement, thereby maintaining operation of the transistors of the decoupled branch within their respective maximum tolerable voltages, per step (820a).

Figure 8B:
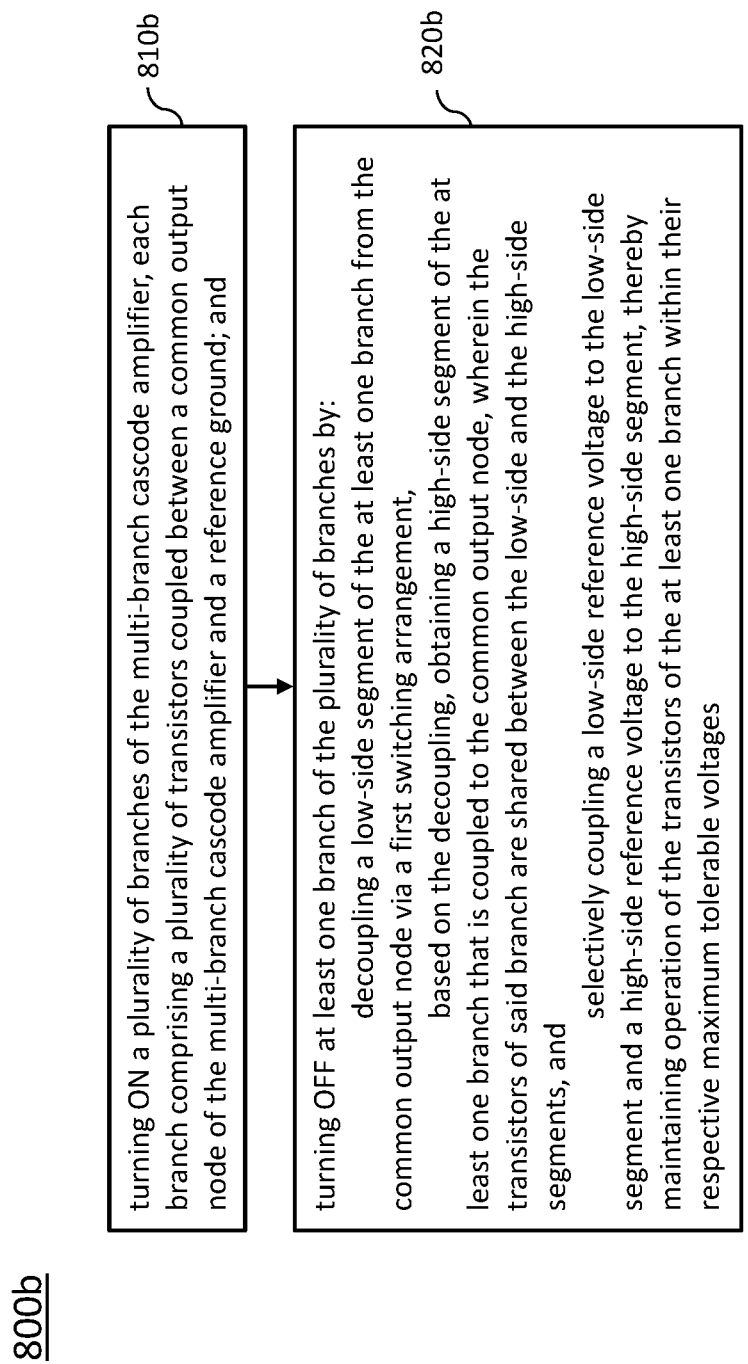
FIG. 8B is a process chart showing various steps of yet another method according to the present disclosure for turning OFF a branch of a multi-branch cascode amplifier.

FIG. 8B is a process chart (800b) showing various steps of a method for turning OFF a branch of a multi-branch cascode amplifier. As can be seen in FIG. 8A, such steps comprise: turning ON a plurality of branches of the multi-branch cascode amplifier, each branch comprising a plurality of transistors coupled between a common output node of the multi-branch cascode amplifier and a reference ground, per step (810a); and turning OFF at least one branch of the plurality of branches by: decoupling a low-side segment of the at least one branch from the common output node via a first switching arrangement, based on the decoupling, obtaining a high-side segment of the at least one branch that is coupled to the common output node, wherein the transistors of said branch are shared between the low-side and the high-side segments, and selectively coupling a low-side reference voltage to the low-side segment and a high-side reference voltage to the high-side segment, thereby maintaining operation of the transistors of the at least one branch within their respective maximum tolerable voltages, per step (820a).

It should be noted that the various embodiments of the multi-branch amplifier circuits according to the present disclosure may be implemented as a monolithically integrated circuit (IC) according to any fabrication technology and process known to a person skilled in the art.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A method for turning OFF a branch of a multi-branch cascode amplifier, the method comprising:
   i) turning ON a plurality of branches of the multi-branch cascode amplifier by:
      providing to each branch of the plurality of branches respective gate biasing voltages to transistors of the branch for operation of the branch as an amplifier during a respective ON state of the branch, the transistors of the branch comprising a common-source input transistor and one or more common-gate cascode transistors; and
      based on the providing, outputting an amplified signal at a common output node of the multi-branch cascode amplifier; and
   ii) turning OFF at least one branch of the plurality of branches by:
      decoupling the at least one branch from the common output node via a first switching arrangement, thereby obtaining a decoupled branch, and
      coupling a reference voltage to a drain node of an output transistor of the decoupled branch via a second switching arrangement, thereby maintaining operation of the transistors of the decoupled branch within their respective maximum tolerable voltages.

2. The method according to claim 1, further comprising:
   maintaining a same biasing voltage of the respective gate biasing voltages to the transistors of the at least one branch during the ON state and the OFF state of said branch.

3. The multi-branch cascode amplifier of claim 1, wherein:
   the input transistor and the one or more cascode transistors of the at least one branch are thin-oxide transistors, and each of the respective maximum tolerable voltages is smaller than a supply voltage to the multi-branch cascode amplifier that is coupled to the common output node.

4. The method according to claim 1, wherein:
the input transistor or at least one of the one or more cascode transistors of the at least one branch is a thin-oxide transistor, and
the maximum tolerable voltage of the thin-oxide transistor is smaller than a supply voltage to the multi-branch cascode amplifier that is coupled to the common output node.

5. The method according to claim 1, wherein:
a source of the input transistor of the at least one branch is coupled to a reference ground, and
the reference voltage is the reference ground.

6. The method according to claim 1, further comprising:
coupling, through an inductor, the source of the input transistor of the at least one branch to a reference ground.

7. The method according to claim 1, further comprising:
implementing the first switching arrangement via one of: a) an electromechanical switch, or b) a MEMS switch.

8. The method according to claim 1, further comprising:
implementing the first switching arrangement via a thick-oxide transistor having a maximum tolerable voltage that is greater than a supply voltage to the multi-branch cascode amplifier that is coupled to the common output node.

9. The method according to claim 8, further comprising:
coupling a drain of the thick-oxide transistor to the common output node;
coupling a source of the thick-oxide transistor to the drain of the output transistor of the at least one branch; and
coupling, through a gate resistor, a gate of the thick-oxide transistor to a biasing voltage.

10. The method according to claim 9, further comprising:
coupling a shunting switch to the gate of the thick-oxide transistor.

11. The method according to claim 10, further comprising:
opening the shunting switch during the ON state of the at least one branch, thereby coupling the biasing voltage to the gate of the thick-oxide transistor and operating the thick-oxide transistor in its triode region of operation.

12. The method according to claim 11, further comprising:
closing the shunting switch during the OFF state of the at least one branch, thereby grounding the gate of the thick-oxide transistor.

13. The method according to claim 12, further comprising:
reducing a level of the biasing voltage during the OFF state of the first branch.

14. The method according to claim 10, further comprising:
implementing the shunting switch via a thick-oxide transistor having a maximum tolerable voltage that is greater than the supply voltage.

15. The method according to claim 8, further comprising:
connecting a diode between a body and a gate of the thick-oxide transistor.

16. The method according to claim 8, further comprising:
connecting a short between a body and a source of the thick-oxide transistor.

17. The method according to claim 1, further comprising:
maintaining a same biasing voltage to a gate of the output transistor of the at least one branch during the ON state and the OFF state of said branch.

18. The method according to claim 1, wherein:
the supply voltage is about 3.4 Volts,
each branch consists of the common-source input transistor and the common-gate cascode output transistor, and
the common-source input transistor and the common-gate cascode output transistor of each branch is a thin-oxide transistor with a maximum tolerable voltage of about 1.3 Volts.

19. The method according to claim 1, further comprising:
monolithically integrating the multi-branch cascode amplifier.

20. A method for turning OFF a branch of a multi-branch cascode amplifier, the method comprising:
turning ON a plurality of branches of the multi-branch cascode amplifier, each branch comprising a plurality of transistors coupled between a common output node of the multi-branch cascode amplifier and a reference ground; and
turning OFF at least one branch of the plurality of branches by:
decoupling a low-side segment of the at least one branch from the common output node via a first switching arrangement,
based on the decoupling, obtaining a high-side segment of the at least one branch that is coupled to the common output node, wherein the transistors of said branch are shared between the low-side and the high-side segments, and
selectively coupling a low-side reference voltage to the low-side segment and a high-side reference voltage to the high-side segment, thereby maintaining operation of the transistors of the at least one branch within their respective maximum tolerable voltages.

21. The method according to claim 20, wherein the selectively coupling comprises:
coupling the low-side reference voltage to a drain of an output transistor of the at least one branch when the low-side segment includes all of the transistors of said branch.

22. The method according to claim 20, wherein the selectively coupling comprises:
coupling the high-side reference voltage to a source of an input transistor of the at least one branch when the high-side segment includes all of the transistors of said branch.

23. The method according to claim 20, wherein the selectively coupling comprises:
coupling the low-side reference voltage and the high-side reference voltage to a respective low-side terminal and high-side terminal of the first switching arrangement when each of the low-side and high-side segments includes at least one transistor of the transistors of the at least one branch.

* * * * *